United States Patent
Ji et al.

(10) Patent No.: US 11,057,036 B2
(45) Date of Patent: Jul. 6, 2021

(54) SWITCHING OPERATION SENSING DEVICE THAT DISTINGUISHES TOUCH REGIONS ON SURFACE OF INTEGRATED HOUSING

(71) Applicant: Samsung Electro-Mechanics Co., Ltd., Suwon-si (KR)

(72) Inventors: Yong Woon Ji, Suwon-si (KR); Joo Yul Ko, Suwon-si (KR); Joo Hyoung Lee, Suwon-si (KR); Byung Joo Hong, Suwon-si (KR); Je Hyuk Ryu, Suwon-si (KR); Jong Woo Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/812,620

(22) Filed: Mar. 9, 2020

(65) Prior Publication Data

US 2021/0021264 A1 Jan. 21, 2021

(30) Foreign Application Priority Data

Jul. 18, 2019 (KR) .................. 10-2019-0087205
Dec. 2, 2019 (KR) .................. 10-2019-0158392

(51) Int. Cl.
*G06F 3/041* (2006.01)
*H03K 17/96* (2006.01)
*G06F 1/16* (2006.01)

(52) U.S. Cl.
CPC ....... *H03K 17/9622* (2013.01); *G06F 3/0416* (2013.01); *G06F 1/1671* (2013.01); *H03K 2217/96071* (2013.01)

(58) Field of Classification Search
USPC ........................................ 345/156
See application file for complete search history.

(56) References Cited

U.S. PATENT DOCUMENTS

| 5,673,041 A * | 9/1997 | Chatigny ............... H03K 17/94 341/22 |
| 2007/0273560 A1* | 11/2007 | Hua ...................... G06F 3/0383 341/33 |
| 2009/0095542 A1* | 4/2009 | Moon ..................... G06F 3/044 178/18.06 |

(Continued)

FOREIGN PATENT DOCUMENTS

| JP | 2012-168747 A | 9/2012 |
| JP | 2015-95865 A | 5/2015 |

(Continued)

*Primary Examiner* — Chineyere D Wills-Burns
(74) *Attorney, Agent, or Firm* — NSIP Law

(57) ABSTRACT

A switching operation sensing device is provided. The device includes a touch operation unit that is integrally formed with a housing and includes first and second touch members disposed in different regions; an oscillator circuit configured to generate a first oscillation signal including a variable resonant frequency when the first touch member is touched and a second oscillation signal including a variable resonant frequency when the second touch member is touched; and a touch detector circuit configured to detect whether at least one of the first and second touch members has been touched, and distinguish touch regions based on the first oscillation signal and the second oscillation signal.

24 Claims, 16 Drawing Sheets

(56) References Cited

U.S. PATENT DOCUMENTS

| | | | | |
|---|---|---|---|---|
| 2010/0212975 A1* | 8/2010 | Moon | ................. | H03K 17/962 |
| | | | | 178/18.06 |
| 2011/0169506 A1* | 7/2011 | Aubauer | ............. | H03K 17/962 |
| | | | | 324/633 |
| 2011/0175834 A1* | 7/2011 | Han | ..................... | G06F 3/0446 |
| | | | | 345/173 |
| 2012/0007829 A1* | 1/2012 | Zhang | ................ | G06F 11/0736 |
| | | | | 345/174 |
| 2012/0105260 A1* | 5/2012 | Philipp | ............. | H03K 17/9622 |
| | | | | 341/26 |
| 2012/0268144 A1* | 10/2012 | Ahn | ..................... | G06F 3/0416 |
| | | | | 324/679 |
| 2013/0106769 A1* | 5/2013 | Bakken | ................ | G06F 3/0445 |
| | | | | 345/174 |
| 2014/0320445 A1* | 10/2014 | Kim | .................... | G06F 3/03545 |
| | | | | 345/174 |
| 2015/0130649 A1 | 5/2015 | Itakura et al. | | |
| 2017/0083126 A1* | 3/2017 | Lim | ..................... | G06F 3/0416 |
| 2017/0083132 A1* | 3/2017 | Araki | .................. | H03K 17/962 |
| 2017/0090599 A1* | 3/2017 | Kuboyama | ........... | G04G 21/08 |
| 2018/0093695 A1 | 4/2018 | Hattori et al. | | |
| 2018/0120364 A1 | 5/2018 | Lee et al. | | |
| 2018/0260049 A1* | 9/2018 | O'Lionaird | ......... | G06F 3/04166 |
| 2019/0079632 A1* | 3/2019 | He | ..................... | G06F 3/04162 |

FOREIGN PATENT DOCUMENTS

| | | |
|---|---|---|
| KR | 2002-0077836 A | 10/2002 |
| KR | 10-2009-0120709 A | 11/2009 |
| KR | 10-2011-0087004 A | 8/2011 |
| KR | 10-2011-0087014 A | 8/2011 |
| KR | 10-2018-0046833 A | 5/2018 |

\* cited by examiner

SWITCHING OPERATION SENSING DEVICE THAT DISTINGUISHES TOUCH REGIONS ON SURFACE OF INTEGRATED HOUSING

CROSS-REFERENCE TO RELATED APPLICATIONS

This application claims the benefit under 35 USC § 119(a) of Korean Patent Application No. 10-2019-0087205 filed on Jul. 18, 2019, and Korean Patent Application No. 10-2019-0158392 filed on Dec. 2, 2019 in the Korean Intellectual Property Office, the entire disclosures of which are incorporated herein by reference for all purposes.

BACKGROUND

1. Field

The following description relates to a switching operation sensing device that distinguishes touch regions on a surface of an integrated housing.

2. Description of Related Art

Typically, it is preferable that wearable devices have a thin and simplified design. To that extent, typical mechanical switches are rarely being implemented in wearable devices. Waterproof and dustproof techniques are currently being implemented, therefore resulting in device models that have a smooth and integrated design.

Currently, techniques such as a touch-on-metal (TOM) technique of touching a metal, a capacitance sensing method using a touch panel, a micro-electro-mechanical-system (MEMS), a micro strain gauge, a force-touching function and similar techniques have been developed.

With regard to typical mechanical switches, a relatively large size and a relatively large amount of internal or inner space may be needed to implement switch functions. Additionally, in structures in which a switch is not integrated with an external case, the mechanical switches may result in a structure that has an externally protruding design. Accordingly, a structure that has a mechanical switch may result in an obtrusive design, and may require a large inner space.

Additionally, there may be a risk of an electric shock if direct contact is made with an electrically connected mechanical switch, and dust-proofing and water-proofing of a mechanical switch may be difficult due to the structural deficiencies of mechanical switches.

Although various methods for performing a button function without a button for performing such a function have been suggested as described above, an isolation process for distinguishing electrical signals in different regions for performing respective button functions or a structure for recognizing physical force may be beneficial.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, switching operation sensing device includes an input operation unit comprising a first touch member and a second touch member integrally formed with a housing, an oscillator circuit configured to generate a first oscillation signal based on a first variable resonant frequency when the first touch member is touched, and generate a second oscillation signal based on a second variable resonant frequency when the second touch member is touched; and a touch detector circuit configured to detect respective touch regions of the housing based on the generated first oscillation signal and the generated second oscillation signal.

The first touch member and the second touch member may be formed in different regions of the housing.

The touch detector circuit may be configured to detect whether at least one of the first touch member and the second touch member is touched, and to distinguish the respective touch regions, based on a change in a frequency of the first oscillation signal and a change in a frequency of the second oscillation signal.

The touch detector circuit may include a frequency calculator circuit configured to convert the first oscillation signal and the second oscillation signal into a first count value and a second count value, and a touch operation distinguishing circuit configured to perform a calculation process based on the first count value and the second count value, detect whether at least one of the first touch member and the second touch member is touched, and distinguish the respective touch regions based on calculation values generated in the calculation process.

The oscillator circuit may include a first oscillator circuit configured to generate the first oscillation signal based on a change in impedance from a touch operation input through the first touch member, and a second oscillator circuit configured to generate the second oscillation signal based on a change in impedance from a touch operation input through the second touch member.

The first oscillator circuit may include a first inductance circuit configured to provide a variable inductance when a touch by a first object is input through the first touch member, a first capacitance circuit configured to have a variable capacitance when a touch by a second object is input through the first touch member, and a first amplifier circuit configured to generate the first oscillation signal having the first variable resonant frequency, wherein the first variable resonant frequency is generated by the first inductance circuit and the first capacitance circuit.

The first object may be a conductor, and the second object may be a human body.

The second oscillator circuit may include a second inductance circuit configured to provide a variable inductance when a touch by a first object is input through the second touch member, a second capacitance circuit configured to have a variable capacitance when a touch by a second object is input through the second touch member; and a second amplifier circuit configured to generate the second oscillation signal having the second variable resonant frequency, wherein the second variable resonant frequency is generated by the second inductance circuit and the second capacitance circuit.

The first object may be a conductor, and the second object may be a human body.

The frequency calculator circuit may include a first frequency calculator circuit configured to convert the first oscillation signal to a first count value; and a second frequency calculator circuit configured to convert the second oscillation signal to a second count value.

The touch operation distinguishing circuit may be configured to distinguish objects touched through the first touch member and the second touch member based on the change in the frequency of the first oscillation signal and the change in the frequency of the second oscillation signal.

The touch operation distinguishing circuit may include a first touch recognition unit configured to detect whether the first touch member is touched based on the first count value, and generate a first touch recognition flag, a second touch recognition unit configured to detect whether the second touch member is touched based on the second count value, and generate a second touch recognition flag, a first waveform calculator unit configured to generate a first calculation value by calculating the first count value and the second count value based on the first touch recognition flag when a touch operation is detected, a second waveform calculator unit configured to generate a second calculation value by calculating the second count value and the first count value based on the second touch recognition flag when the touch operation is detected, and a touch region distinguishing circuit configured to compare the first calculation value with the second calculation value, generate an index to distinguish the respective touch regions, and generate a touch detection signal.

The touch operation distinguishing circuit may further include a first waveform calculator unit configured to generate a first calculation value by calculating the first count value and the second count value, a second waveform calculator unit configured to generate a second calculation value by calculating the second count value and the first count value, a first touch recognition unit configured to determine whether the first touch member is touched based on the first calculation value, and generate a first touch recognition flag, a second touch recognition unit configured to determine whether the second touch member is touched based on the second calculation value, and generate a second touch recognition flag, and a touch region distinguishing circuit configured to generate a touch detection signal based on the first touch recognition flag, the second touch recognition flag, the first calculation value, and the second calculation value, to compare the first calculation value with the second calculation value, and generate an index to distinguish the respective touch regions.

The first touch recognition unit may be configured to compare the first count value with a first threshold value, and generate the first touch recognition flag with a relatively high level when the first object is touched.

The second touch recognition unit may be configured to compare the second count value with the first threshold value, and generate the second touch recognition flag with a relatively high level when the first object is touched.

The first waveform calculator unit may include a first delay unit configured to output a first delay value by delaying the first count value by a predetermined period of time in response to a first delay control signal, and a first subtraction circuit configured to output the first calculation value by subtracting the first delay value and the first count value.

The second waveform calculator unit may include a second delay unit configured to output a second delay value by delaying the second count value by a predetermined period of time in response to a second delay control signal, and a second subtraction circuit configured to output the second calculation value by subtracting the second delay value and the second count value.

The touch region distinguishing circuit may be configured to compare the first calculation value, the second calculation value, and a threshold value with each other, and determine that the first touch member is a touch region when the first calculation value is greater than the threshold value and the second calculation value.

The touch region distinguishing circuit may be configured to compare the first calculation value, the second calculation value, and a threshold value with each other, and determine that the second touch member is a touch region when the second calculation value is greater than the threshold value and the first calculation value.

The device may be any one of a Bluetooth headset, a Bluetooth earpiece, smart glasses; a virtual reality (VR) headset, an Augmented Reality (AR) headset, a laptop, a computer, a smart phone, an entrance key of a vehicle, and a stylus touch pen.

In a general aspect, an apparatus includes an input operation unit comprising a plurality of detectors, an oscillation circuit configured to generate a plurality of oscillation signals, and a detector circuit configured to convert the generated oscillated signals to respective count values, and detect a touch at one or more of the plurality of detectors by comparing each of the count values to a threshold value, and output a touch detection signal based on a result of the comparing.

The oscillation signals may have a variable resonant frequency that is based on the detected touch.

A first type of touch may be detected by a capacitive sensing, and a second type of touch may be detected by an inductive sensing.

The first type of touch may be a human touch and the second type of touch may be a non-human touch.

Other features and aspects will be apparent from the following detailed description, the drawings, and the claims.

Figure 1:
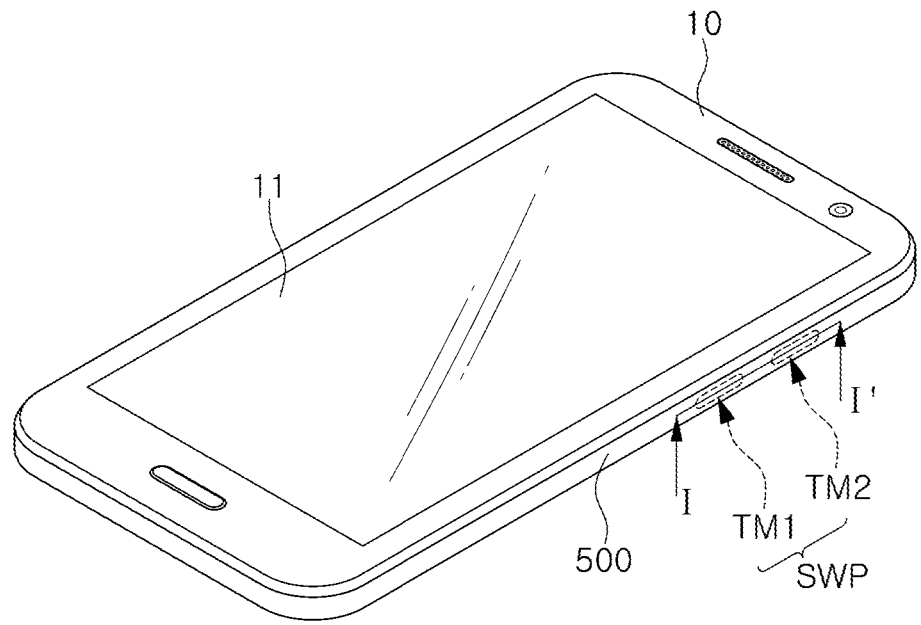
FIG. 1 illustrates an example of an exterior of a mobile device to which a switching operation sensing device is applied, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

FIG. 1 illustrates an example of an exterior of a mobile device, for example, mobile device 10, to which a switching operation sensing device is applied, in accordance with one or more embodiments.

Referring to FIG. 1, a mobile device 10 in the example may include a touch screen 11, a housing 500, and a touch operation unit SWP.

The touch operation unit SWP may include first and second touch members TM1 and TM2, which may replace mechanical button-type switches.

FIG. 1 illustrates the first and second touch members TM1 and TM2, but the examples are not limited to two such touch members, the first and second touch members. In an example, the touch members may include a greater number of touch members.

In an example, the mobile device 10 may be implemented by a portable device such as a smartphone, and may be implemented as a wearable device such as a smartwatch. However, an example embodiment thereof is not limited thereto, and the mobile device 10 may be implemented by another type of wearable or portable electrical device or an electrical device having a switch for operation control. In an example the device may be a personal computer or a notebook computer, but is not limited thereto.

The housing 500 may be configured as an exterior case externally exposed on an electrical device. As an example, when the switching operation sensing device is applied to a mobile device, the housing 500 may be configured as a cover disposed on a side (for example, a lateral surface) of the mobile device 10. In an example, the housing 500 may be integrated, or may be integrally formed, with a cover disposed on a rear surface of the mobile device 10, or may be separated from a cover disposed on the rear surface of the mobile device 10.

The first and second touch members TM1 and TM2 may be disposed on the housing 500, but the examples are not limited thereto. The switching operation sensing device may be disposed on a housing of an electrical device.

The first and second touch members TM1 and TM2 may be disposed on a cover of the mobile device. In this example, the cover may be configured as a cover other than a touch screen, a side cover, a rear cover, a cover formed on a portion of a front side, or the like, for example. As an example of the housing, the example in which the housing is disposed on a side cover of the mobile device will be described for ease of description, but an example embodiment thereof is not limited thereto.

In the examples, in the process of counting a reference clock using an oscillation frequency, generating a count value, and recognizing a touch on the basis of the amount of change of the count value when a touch operation is input, a plurality of touch members disposed on a surface of an integrated housing may be distinguished from each other without using an isolation or shielding structure or an interference prevention circuit based on a difference in reactivity caused by inductance L or capacitance C, caused by a temperature of a human body, and also an external factor which determines a resonant frequency depending on a surface material, when a touch operation is input, such that a respective touch region may be determined, or an object that initiates a touch on the touch region may be distinguished.

In the diagrams, the unnecessary overlapping descriptions in relation to the same reference numeral and the same function will not be provided, and mainly differences among the examples in the diagrams will be described.

Figure 2:
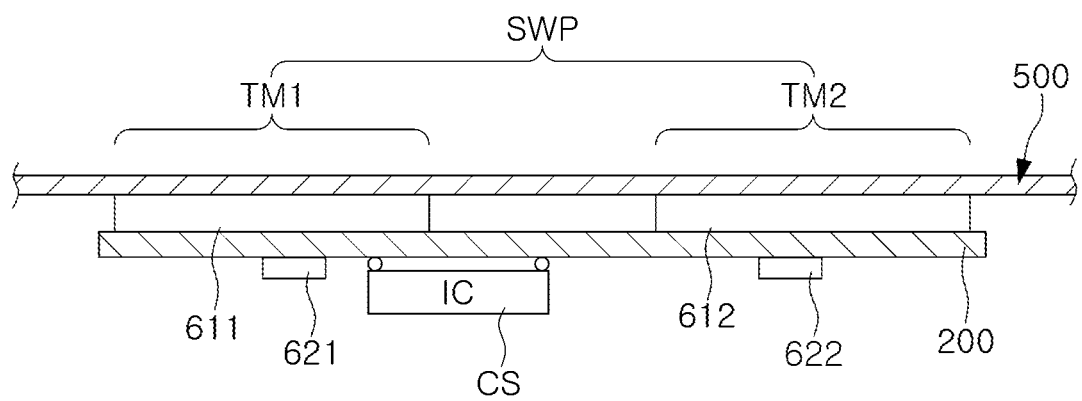
FIG. 2 is a cross-sectional diagram illustrating an example of a switching operation sensing device taken along line I-I' in FIG. 1B.

FIG. 2 is a cross-sectional diagram illustrating an example of a switching operation sensing device taken along line I-I' in FIG. 1B.

Figure 3:
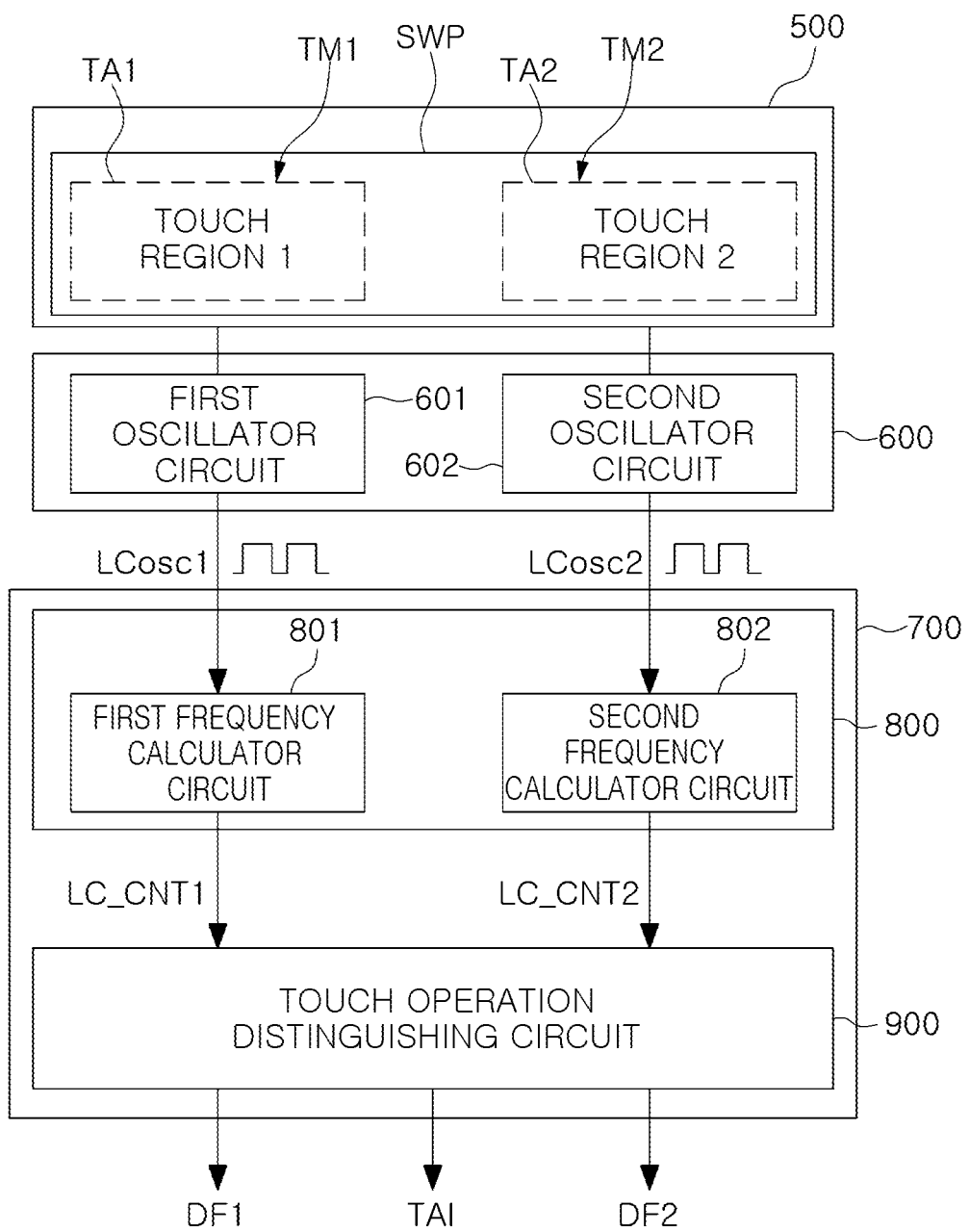
FIG. 3 illustrates an example of a switching operation sensing device, in accordance with one or more embodiments.

Referring to FIG. 2, a switching operation sensing device may include a touch operation unit SWP including first and second touch members TM1 and TM2, an oscillator circuit 600 (shown in FIG. 3), and a touch detector circuit 700 (shown in FIG. 3).

The touch operation unit SWP may be integrated, or may be integrally formed, with a housing 500 of an electrical device, and may include the first touch member TM1 and the second touch member TM2 disposed in different positions. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

As an example, the first and second touch members TM1 and TM2 may be composed of a material that is the same as a material of the housing 500.

As an example, when the housing 500 is formed of a conductor (e.g., a first object) such as a metal, the first and second touch members TM1 and TM2 may also be formed of a conductor. When the housing 500 is formed of an insulating material such as plastic, the first and second touch members TM1 and TM2 may also be formed of an insulating material.

In an example, the oscillator circuit 600 (in FIG. 3) may be mounted on a substrate 200, and may include a first coil 611 and a second coil 612 disposed on a first surface of the substrate 200. The first coil element 611 may be disposed on an internal or inner side surface of the first touch member TM1, the second coil element 612 may be disposed on an internal or inner side surface of the second touch member TM2, and a first capacitor device 621 and a second capacitor device 622 may be mounted on a second surface of the substrate 200.

The touch detector circuit 700 (shown in FIG. 3) may be included in a circuit unit CS and may be disposed on the second surface of the substrate 200. In an example, the circuit unit CS may be configured as an integration circuit IC.

FIG. 2 illustrates one example, and the examples are not limited thereto.

For example, the first and second coil elements 611 and 612 may be disposed on a first surface (e.g., an upper surface) of the substrate 200, and the circuit unit CS and the first and second capacitor devices 621 and 622 such as MLCCs may be disposed on a second surface (e.g., a lower surface), but the example embodiment is not limited thereto.

The substrate 200 may include, but is not limited to, one of a printed circuit board (PCB) and a flexible printed circuit board (FPCB). However, an example embodiment thereof is not limited thereto. The substrate 200 may be configured as a board (e.g., one of various circuit boards, including a PCB) or a panel (e.g., a panel used for a panel level package (PLP)) on which a circuit pattern is formed.

The switching operation sensing device in the examples may include a plurality of touch members including the first and second touch members. As an example, the plurality of touch members may be arranged linearly, or alternatively, the plurality of touch members may be arranged horizontally and vertically such that an overall structure of the plurality of touch members may be configured as a matrix structure.

In the examples, an example in which the switching operation sensing device includes the first and second touch members TM1 and TM2 are described for ease of description, and the examples are not limited thereto.

In an example, the first and second touch members TM1 and TM2 may be integrated with the housing 500, and the configuration in which the first and second touch members TM1 and TM2 may be integrated with the housing 500 indicates that the first and second touch members TM1 and TM2 and the housing 500 may be formed of different materials, but may be integrated with each other while being manufactured such that, after being manufactured, the first and second touch members TM1 and TM2 and the housing 500 may not be mechanically separated, and may be integrated in a closely integrated single structure.

The first and second coil elements 611 and 612 may be disposed on one surface or different surfaces of the substrate 200, may be spaced apart from each other, and may be connected to a circuit pattern formed on the substrate 200. For example, each of the first and second coil elements 611 and 612 may be configured as a solenoid coil, a coil device such as a coil-type inductor, or a chip inductor, but the examples are not limited thereto. Each of the first and second coil elements 611 and 612 may be configured as a device having inductance.

In an example, when a first object such as a conductor (metal) is in contact with a contact surface of the touch operation unit SWP, an inductive sensing principle may be applied such that an overall inductance value may decrease, and accordingly, a resonant frequency may increase.

In another example, when a second object such as a human body (for example, a hand) touches a contact surface of the touch operation unit SWP, a capacitive sensing principle may be applied such that an overall capacitance value may increase, and accordingly, a resonant frequency may decrease.

In the example, a capacitive sensing method and/or an inductive sensing method may be applied depending on an object that is in contact with the contact surfaces of the first and second touch members TM1 and TM2 integrally formed with the housing 500 of the mobile device, and accordingly, the objects in contact with the touch operation unit SWP may be distinguished from each other.

As a material of the touch surface of the touch operation unit SWP, aluminum or other various metals, or a non-metal such as glass may be used, and any structure in which contact between the touch region and a human body causes changes in inductance L and capacitance C included in the oscillator circuit may be applied.

FIG. 3 illustrates an example of a switching operation sensing device, in accordance with one or more embodiments.

Referring to FIG. 3, a switching operation sensing device may include a touch operation unit SWP, an oscillator circuit 600, and a touch detector circuit 700.

The touch operation unit SWP may be integrally formed with a housing 500, and may include first and second touch members or touch detectors TM1 and TM2 disposed in different regions.

The oscillator circuit 600 may generate a first oscillation signal LCosc1 including a resonant frequency that changes when the first touch member TM1 is touched, and a second oscillation signal LCosc2 including a resonant frequency that changes when the second touch member TM2 is touched.

The touch detector circuit 700 may identify whether at least one of the first and second touch members TM1 and TM2 has been touched and may distinguish touch regions using the first oscillation signal LCosc1 and the second oscillation signal LCosc2 received from the oscillator circuit 600.

In an example, the touch detector circuit 700 may identify whether at least one of the first and second touch members TM1 and TM2 has been touched, and may distinguish touch regions using a characteristic of a change of a frequency of the first oscillation signal LCosc1 and a characteristic of a change of a frequency of the second oscillation signal LCosc2.

In an example, the oscillator circuit 600 may include a first oscillator circuit 601 and a second oscillator circuit 602.

The first oscillator circuit 601 may generate the first oscillation signal LCosc1 based on a change in impedance caused by a touch operation input through the first touch member TM1. The second oscillator circuit 602 may generate the second oscillation signal LCosc2 based on a change in impedance caused by a touch operation input through the second touch member TM2. In an example, in the impedance change caused by a touch operation, impedance may be at least one of capacitance and inductance.

In an example, the touch detector circuit 700 may include a frequency calculator circuit 800 and a touch operation distinguishing circuit 900.

The frequency calculator circuit 800 may convert the first and second oscillation signals LCosc1 and LCosc2 received from the oscillator circuit 600 to the respective first and second count values LC_CNT1 and LC_NT2.

In an example, the frequency calculator circuit 800 may include a first frequency calculator circuit 801 and a second frequency calculator circuit 802. The first frequency calculator circuit 801 may convert the first oscillation signal LCosc1 received from the oscillator circuit 600 into a first count value LC_CNT1. The second frequency calculator circuit 802 may convert the second oscillation signal LCosc2 into a second count value LC_CNT2.

For example, the first frequency calculator circuit 801 may divide a reference clock signal using a reference frequency divide ratio, and may generate a divided reference clock signal. The first frequency calculator circuit 801 may also count the divided reference clock signal using the first oscillation signal and may output the first count value LC_CNT1.

Additionally, the second frequency calculator circuit 802 may divide a reference clock signal using a reference frequency divide ratio, and may generate a divided reference clock signal. The second frequency calculator circuit 802 may also count the divided reference clock signal using the second oscillation signal and may output the second count value LC_CNT2.

The touch operation distinguishing circuit 900 may perform a calculation process using the first and second count values LC_CNT1 and LC_CNT2, and may identify whether at least one of the first and second touch members TM1 and TM2 has been touched, and may distinguish touch regions, on the basis of a calculation value generated through the calculation process.

The touch operation distinguishing circuit 900 may also distinguish objects touched through the first and second touch members TM1 and TM2, respectively, using a characteristic of a change of a frequency of the first oscillation signal LCosc1 and a characteristic of a change of a frequency of the second oscillation signal LCosc2, received from the oscillator circuit 600.

For example, the touch operation distinguishing circuit 900 may calculate the first count value LC_CNT1 and the second count value LC_CNT2, and may identify which touch member between the first and second touch members TM1 and TM2 is touched. When the first touch member TM1 or the second touch member TM2 is touched, the touch operation distinguishing circuit 900 may output a touch detection signal DFX of a high level. On the other hand, when neither of the first touch member TM1 or the second touch member TM2 is touched, the touch operation distinguishing circuit 900 may output a touch detection signal DFX of a low level.

In an example, when a determination is made that the first touch member TM1 is touched, the touch operation distinguishing circuit 900 may output an index TAI that identifies the touch region to be touch region 1, and when it is determined that the second touch member TM2 is touched, the touch operation distinguishing circuit 900 may output the index TAI that identifies the touch region to be to touch region 2.

Figure 4:
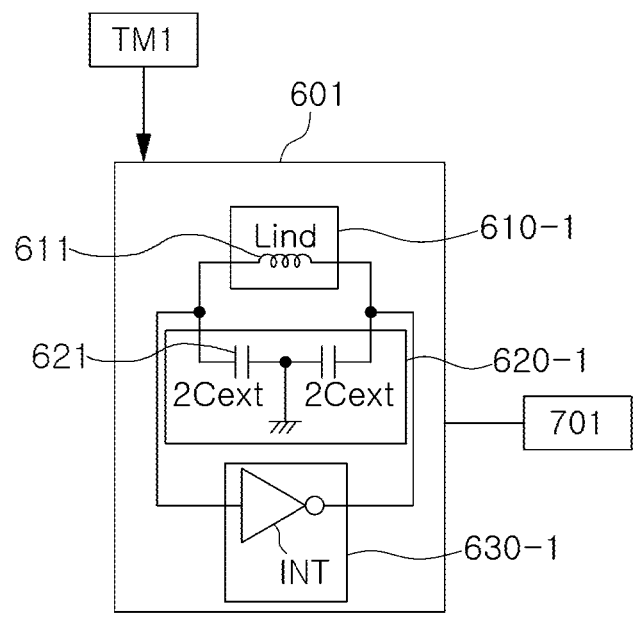
FIG. 4 illustrates an example of a first oscillator circuit, in accordance with one or more embodiments.

FIG. 4 illustrates an example of a first oscillator circuit, in accordance with one or more embodiments.

Referring to FIG. 4, a first oscillator circuit 601 may include a first inductance circuit 610-1, a first capacitance circuit 620-1, and a first amplifier circuit 630-1.

The first inductance circuit 610-1 may include a first coil element 611, and may provide inductance that changes when a touch operation initiated by a first object (e.g., a conductor) is input through, for example, the first touch member TM1.

The first capacitance circuit 620-1 may include a first capacitor device 621, and may include capacitance that changes when a touch operation initiated by a second object (e.g., a human body) is input through, for example, the first touch member TM1.

The first amplifier circuit 630-1 may generate a first oscillation signal LCosc1 having a resonant frequency generated by the first capacitance circuit 620-1 and the first inductance circuit 610-1. As an example, the first amplifier circuit 630-1 may include an inverter INT or an amplifier, but an example embodiment thereof is not limited thereto.

Figure 5:
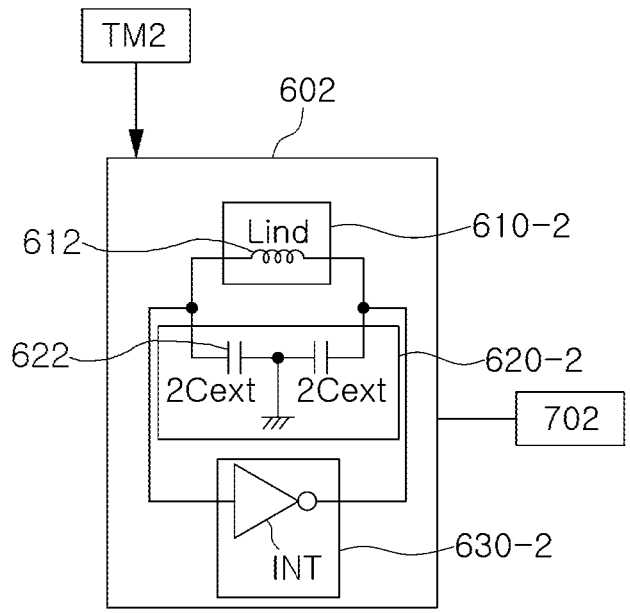
FIG. 5 illustrates an example of a second oscillator circuit, in accordance with one or more embodiments.

FIG. 5 is a diagram illustrating an example of a second oscillator circuit, in accordance with one or more embodiments.

Referring to FIG. 5, the second oscillator circuit 602 may include a second inductance circuit 610-2, a second capacitance circuit 620-2, and a second amplifier circuit 630-2.

The second inductance circuit 610-2 may include a second coil element 612, and may include an inductance that changes when a touch operation by a first object (e.g., a conductor) is input through, for example, a second touch member TM2.

The second capacitance circuit 620-2 may include a second capacitor device 622, and may include a capacitance that changes when a touch operation by a second object (e.g., a human body) is input through, for example, the second touch member TM2.

The second amplifier circuit 630-2 may generate a second oscillation signal LCosc2 having a resonant frequency that is generated by the second inductance circuit 610-2 and the second capacitance circuit 620-2. As an example, the second amplifier circuit 630-2 may include an inverter INT or an amplifier, but an example embodiment thereof is not limited thereto.

In FIGS. 4 to 7, unnecessary overlapping descriptions in relation to the same reference numeral and the same function will not be provided, and mainly differences among the examples in the diagrams will be described.

Figure 6:
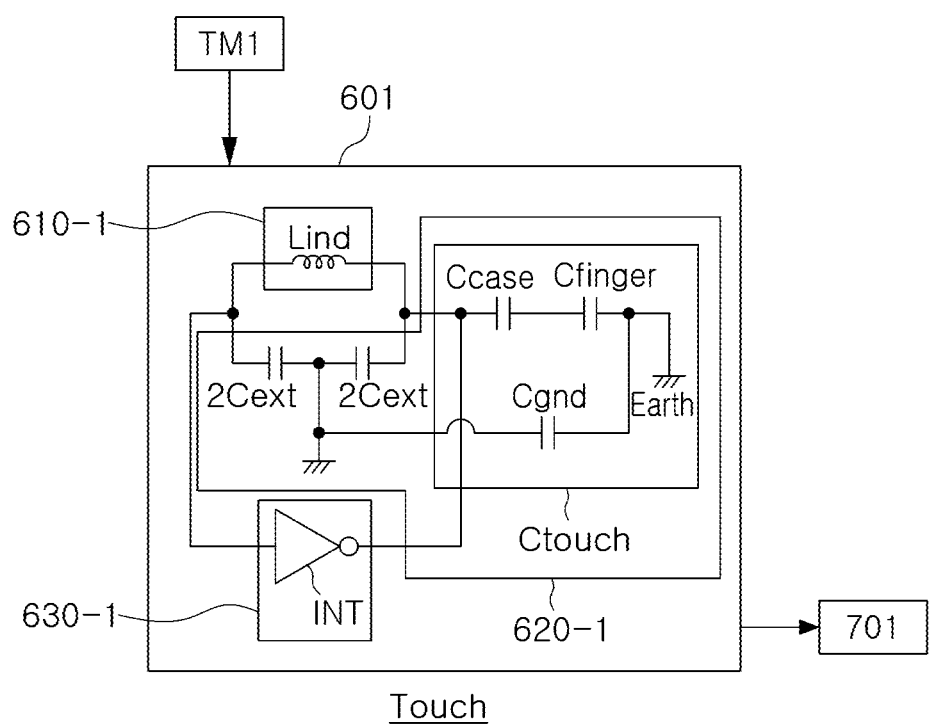
FIG. 6 illustrates an example of a first oscillator circuit when a touch by a human body is input, in accordance with one or more embodiments.

FIG. 6 is a diagram illustrating an example of a first oscillator circuit when a touch by a human body is input, in accordance with one or more embodiments.

Referring to FIG. 6, the first oscillator circuit 601 may include a first inductance circuit 610-1, a first capacitance circuit 620-1, and a first amplifier circuit 630-1.

In an example, when the first touch member TM1 is not touched, the first capacitance circuit 620-1 may include the first capacitor device 621 having capacitance Cext (2Cext+2Cext).

When a touch by a second object such as a human body is input to the first touch member TM1, the first capacitance circuit 620-1 may include the capacitance Cext (2Cext+2Cext) of the first capacitor device 621, and touch capacitance Ctouch generated on the basis of a touch of the first touch member TM1. The touch capacitance Ctouch may be connected in parallel with one of the pieces of capacitance (2Cext+2Cext) of the first capacitor device 621.

For example, the touch capacitance Ctouch may be connected in parallel with one capacitance 2Cext of the capacitance (2Cext+2Cext) of the first capacitor device 621, divided into two portions of capacitance, and may include a plurality of pieces of capacitance Ccase, Cfinger, and Cgnd connected to each other in series.

The element Ccase may be case capacitance, the element Cfinger may be finger capacitance, and the element Cgnd may be ground capacitance between circuit ground and earth.

As an example, a first resonant frequency fres1 of the first oscillator circuit 601 may be represented by Equation 1 below:

$$\text{fres1} \cong 1/\{2\pi\text{sqrt}(\text{Lind}*\text{Cext})\} \qquad \text{Equation 1:}$$

In Equation 1, "≅" indicates that the elements may be the same or may be similar to each other, and the configuration in which the elements are similar to each other may indicate that another value may be included.

A first amplifier circuit of the first oscillator circuit 601 and the touch detector circuit 700 may be implemented as a circuit unit CS. The first capacitor device 621 may be included in the circuit unit CS, or may be disposed externally as a separate device (e.g., an MLCC).

A resistor (not illustrated) may be connected between the first coil element 611 and the second coil element 612, and the resistor may perform an electrostatic discharging function (ESD).

For example, the touch capacitance Ctouch (Ccase, Cfinger, and Cgnd) may be configured as the case capacitance Ccase, the finger capacitance Cfinger, and the ground capacitance Cgnd between circuit ground and earth, connected to each other in series.

As an example, when the capacitance (2Cext+2Cext) of the first capacitor device 621 is represented by an equivalent circuit divided into a first capacitance 2Cext and a second capacitance 2Cext with reference to a circuit ground, the case capacitance Ccase, the finger capacitance Cfinger, and the ground capacitance Cgnd may be connected in parallel with the first capacitance 2Cext and the second capacitance 2Cext.

As described above, when a touch by the second object such as human body is input, the first resonant frequency fres1 of the oscillator circuit 600 may be represented by Equation 2 below.

$$\text{fres1} \cong 1/\{2\pi\text{sqrt}(\text{Lind}*[2\text{Cext}\|(2\text{Cext}+\text{CT})])\}$$

$$\text{CT} \cong \text{Ccase}\|\text{Cfinger}\|\text{Cgnd} \qquad \text{Equation 2:}$$

In Equation 2, "≅" indicates that the elements may be the same as, or similar to, each other, and the configuration in which the elements are similar to each other may indicate that another value may be included. In Equation 2, the element Ccase may be parasitic capacitance present between the case (the cover) and the first coil element 611, the element Cfinger may be capacitance of a human body, and the element Cgnd may be ground return capacitance between circuit ground and earth.

As for "∥" in Equation 2, "a∥b" indicates that "a" and "b" may be defined as being connected to each other in series in terms of a circuit, and a sum value of the elements may be defined as being calculated as "(a*b)/(a+b)".

Comparing Equation 1 (when no touch is input) with Equation 2 (when a touch is input), the capacitance 2Cext of Equation 1 may increase to capacitance (2Cext+Ctouch) of Equation 2, and accordingly, the first resonant frequency fres1 at which no touch is input may decrease to the first resonant frequency fres1 at which a touch is input.

Figure 7:
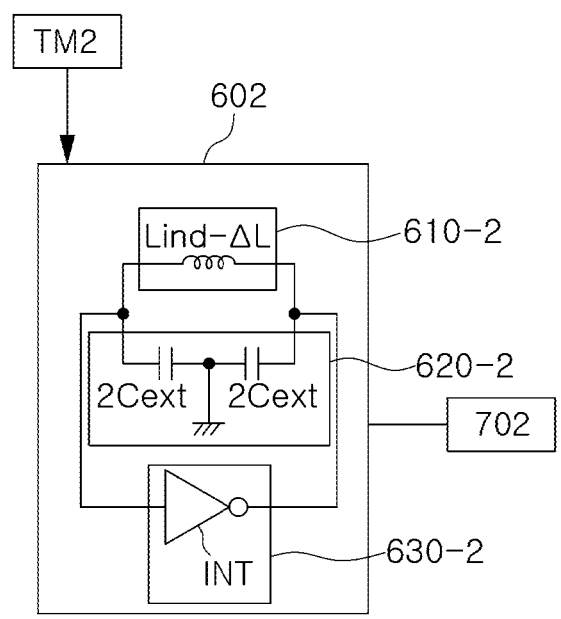
FIG. 7 illustrates an example of a second oscillator circuit when a touch by a conductor is input, in accordance with one or more embodiments.

FIG. 7 illustrates an example of a second oscillator circuit when a touch by a conductor is input.

Referring to FIG. 7, a second oscillator circuit 602 may include a second inductance circuit 610-2, a second capacitance circuit 620-2, and a second amplifier circuit 630-2.

As an example, when the first touch member TM1 is not touched, the second capacitance circuit 620-2 may include a second capacitor device 622 having capacitance Cext (2Cext+2Cext).

When a touch by a first object such as, for example, a conductor (metal) is input, the second inductance circuit 610-2 may include inductance Lind of the second coil element 612 and touch inductance $-\Delta L$ generated on the basis of a touch of the second touch member TM2. The touch inductance $-\Delta L$ may decrease the inductance Lind of the second coil element 612 as illustrated in FIG. 7.

Accordingly, when a first object such as a conductor (metal) touches a contact surface of the second touch member TM2, inductive sensing may be applied such that inductance by an eddy current may decrease, and a resonant frequency may increase.

When a structure based on a combination of the two methods is used as described above, a touch that is initiated by the second object such as a human body (e.g., a hand) and a touch that is initiated by the first object such as a conductor (e.g., a metal) may be distinguished from each other according to the characteristic of change of the final output frequency.

The inductive sensing principle that is applied to a touch by the first object such as a conductor is described below.

When the second oscillator circuit operates, an AC current may be generated in the second coil element, and a magnetic field H-Field generated by the AC current may be generated. When a contact by a metal is input, the magnetic field H-Field of the second coil element may affect the metal such that a circulating current, an eddy current, may be generated, and a magnetic field H-Field formed in a reverse direction may be generated by the eddy current. That is because, as the sensing device operates in a direction in which the magnetic field H-Field of the second coil element decreases, inductance of the second coil element may decrease, and a resonant frequency may increase.

Figure 8:
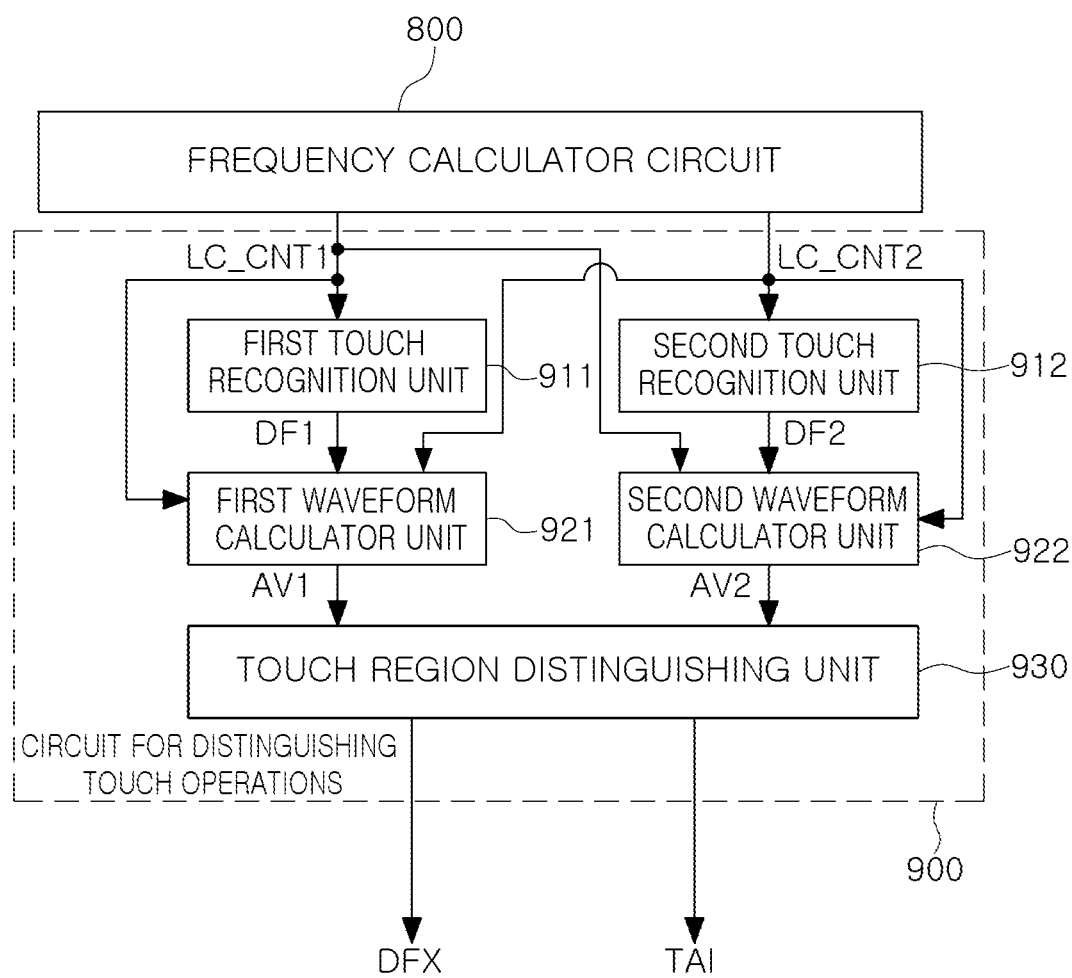
FIG. 8 illustrates an example of a touch operation distinguishing circuit, in accordance with one or more embodiments.

FIG. 8 illustrates an example of each of a coil element, an integrated circuit, and a capacitor element, in accordance with one or more embodiments.

Referring to FIG. 8, a touch operation distinguishing circuit 900 may include a first touch recognition unit 911, a second touch recognition unit 912, a first waveform calculator unit 921, a second waveform calculator unit 922, and a touch region distinguishing unit 930.

In an example, the first touch recognition unit 911 may recognize whether the first touch member TM1 is touched based on a first count value LC_CNT1, and may generate a first touch recognition flag DF1 based on a result of the recognition.

The first waveform calculator unit 921 may recognize whether the second touch member TM2 is touched based on a second count value LC_CNT2 and may generate a second touch recognition flag DF2.

When a touch operation is recognized based on the first touch recognition flag DF1, the first waveform calculator unit 921 may calculate the first count value LC_CNT1 and the second count value LC_CNT2, and may generate a first calculation value AV1.

When a touch operation is recognized based on the second touch recognition flag DF2, the second waveform calculator unit 922 may calculate the second count value LC_CNT2 and the first count value LC_CNT1 and may generate a second calculation value AV2.

The touch region distinguishing unit 930 may compare the first calculation value AV1 and the second calculation value AV2, and may generate an index TAI that distinguishes the respective touch regions, and a touch detection signal DFX. In an example, a touch operation may be performed on a touch member that has a larger value between the first and second calculation values AV1 and AV2 based on a level of the index TAI for distinguishing touch regions.

For example, as the calculations in the first waveform calculator unit 921 and second waveform calculator unit 922, at least one of various methods such as algebraic calculation, differentiation, masking, an absolute value, normalization, scaling, and the like, may be used in accordance with a mechanical structure and algorism.

In an example, when the above-described calculation is differentiation, the first and second calculation value AV1 and AV2 may be differential values, and in this example, a method of using the differential values may demonstrate a recognition performance that is more stable and is faster than an approach of simply comparing a count value that constantly changes in accordance with a touch-state of a surface of the first touch member with a threshold.

Figure 9:
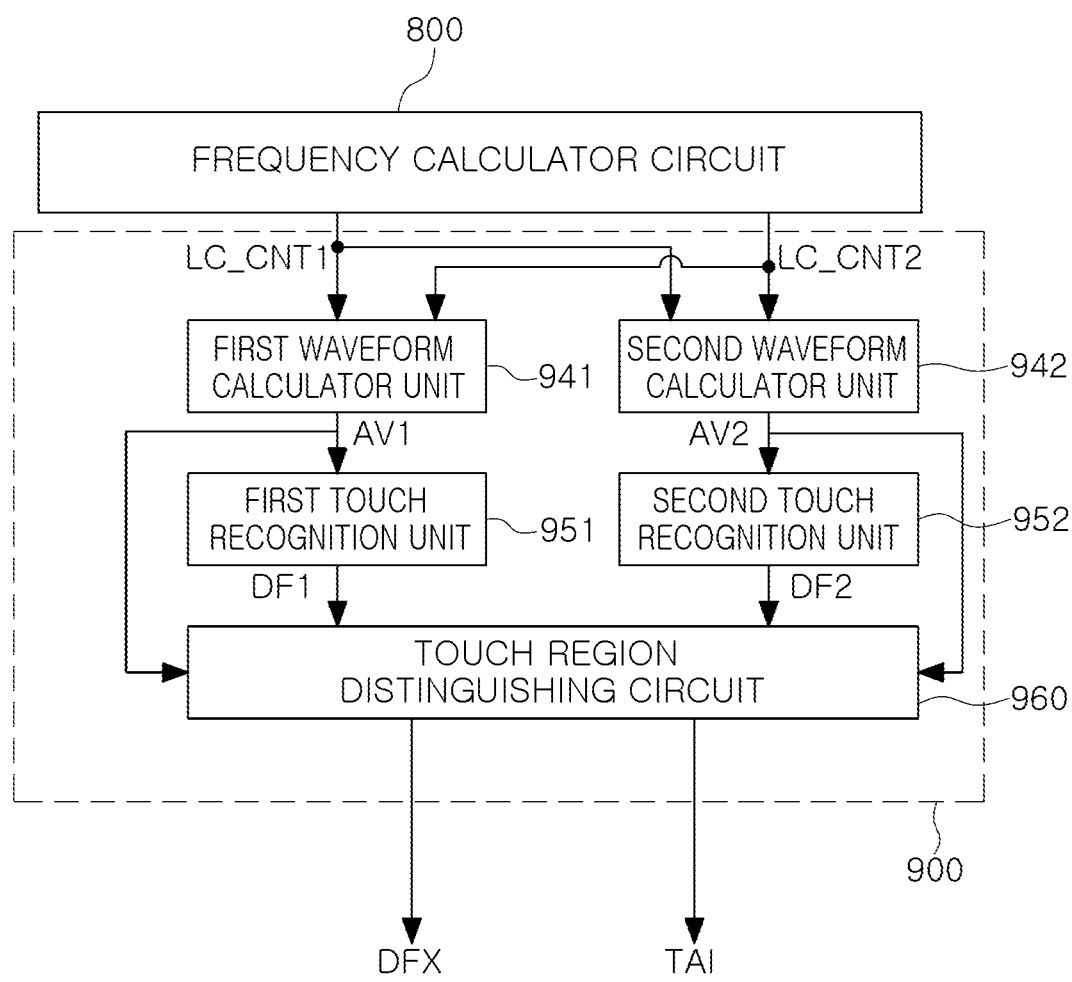
FIG. 9 illustrates an example of a touch operation distinguishing circuit, in accordance with one or more embodiments.

FIG. 9 illustrates an example of a touch operation distinguishing circuit, in accordance with one or more embodiments.

Referring to FIG. 9, a touch operation distinguishing circuit 900 may include a first waveform calculator unit 941, a second waveform calculator unit 942, a first touch recognition unit 951, a second touch recognition unit 952, and a touch region distinguishing circuit 960.

The first waveform calculator unit 941 may generate a first calculation value AV1 by calculating a first count value LC_CNT1 and a second count value LC_CNT2.

The second waveform calculator unit 942 may generate a second calculation value AV2 by calculating the first count value LC_CNT1 and the second count value LC_CNT2.

The first touch recognition unit 951 may recognize whether a first touch member TM1 is touched based on the first calculation value AV1, and may generate a first touch recognition flag DF1.

The second touch recognition unit 952 may recognize whether a second touch member TM2 is touched based on the second calculation value AV2, and may generate a second touch recognition flag DF2.

The touch region distinguishing circuit 960 may generate a touch detection signal DFX based on the first touch recognition flag DF1, the second touch recognition flag DF2, the first calculation value AV1, and the second calculation value AV2, and may compare the first calculation value AV1 with the second calculation value AV2, and may generate an index TAI that distinguishes respective touch regions. In an example, a touch operation may be performed on a touch member that has a larger value between the first and second calculation values AV1 and AV2 based on a level of the index TAI for distinguishing touch regions.

Figure 10:
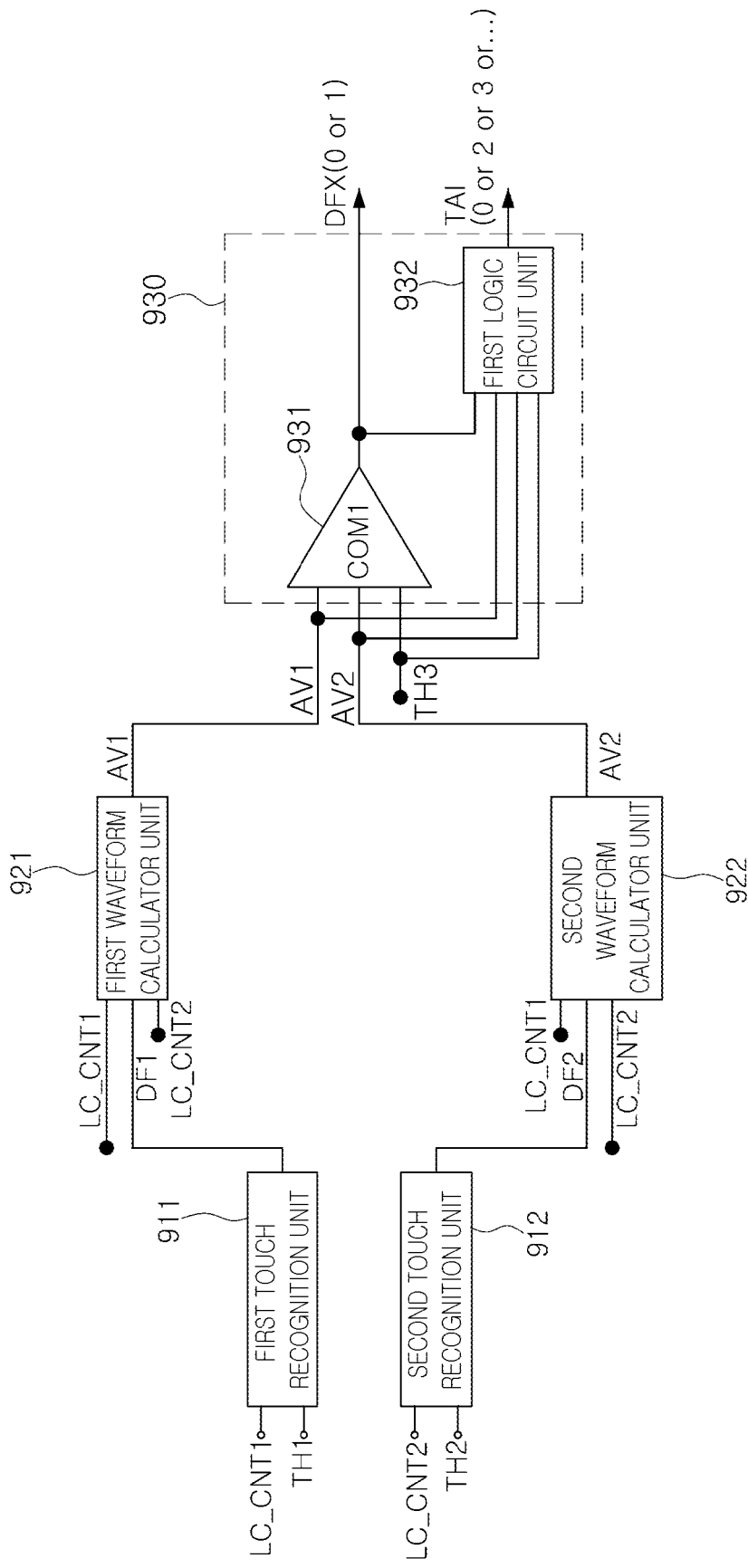
FIG. 10 illustrates an example of a touch operation distinguishing circuit, in accordance with one or more embodiments.

FIG. 10 illustrates an example of the configuration illustrated in FIG. 8.

Referring to FIG. 10, a first touch recognition unit 911 may compare a first count value LC_CNT1 with a first threshold TH1, and may generate a first touch recognition flag DF1 that has a relatively high level when a touch by a first object (for example, a conductor) is input.

As an example, when the first touch recognition flag DF1 has a relatively high level, it may be recognized that a touch operation may be performed on the first touch member TM1.

The second touch recognition unit 912 may compare the second count value LC_CNT2 with a second threshold value TH2 and may generate a second touch recognition flag DF2 having a relatively high level when a touch by the first object is input.

In an example, when the second touch recognition flag DF2 has a relatively high level, a touch operation may be performed on the second touch member TM2.

When a touch operation is recognized based on the first touch recognition flag DF1, the first waveform calculator unit 921 may generate a first calculation value AV1 by differentiating a sum of the first count value LC_CNT1 and the second count value LC_CNT2 or a difference value between the first count value LC_CNT1 and the second count value LC_CNT2.

When a touch operation is recognized based on the second touch recognition flag DF2, the second waveform calculator unit 922 may generate a second calculation value AV2 by differentiating a sum of the first count value LC_CNT1 and the second count value LC_CNT2, or a difference value between the first count value LC_CNT1 and the second count value LC_CNT2.

In an example, the touch region distinguishing unit 930 may include a first comparator COM1 931 and a first logic circuit unit 932.

The first comparator COM1 931 may compare the first calculation value AV1, the second calculation value AV2, and a third threshold value TH3 with one another, and when a touch operation is recognized, the first comparator COM1 931 may generate a touch detection signal DFX that has a relatively high level.

When the touch detection signal DFX has a relatively high level, and the first calculation value AV1 and the second calculation value AV2 are higher than the third threshold value TH3, the first logic circuit unit 932 may recognize that a touch operation is being performed on a touch member corresponding to a higher value between the first calculation value AV1 and the second calculation value AV2 based on the first calculation value AV1, the second calculation value AV2, and the third threshold value TH3. Accordingly, as the index TAI for distinguishing touch regions, one of, as non-limiting examples, 0, 1, and 2 may be output.

In an example, with regard to the index TAI for distinguishing touch regions, "0" may indicate that no touch is input, the index TAI for distinguishing touch regions "1" may indicate that the first touch member is touched, and the index TAI for distinguishing touch regions "2" may indicate that the second touch member is touched.

Figure 11:
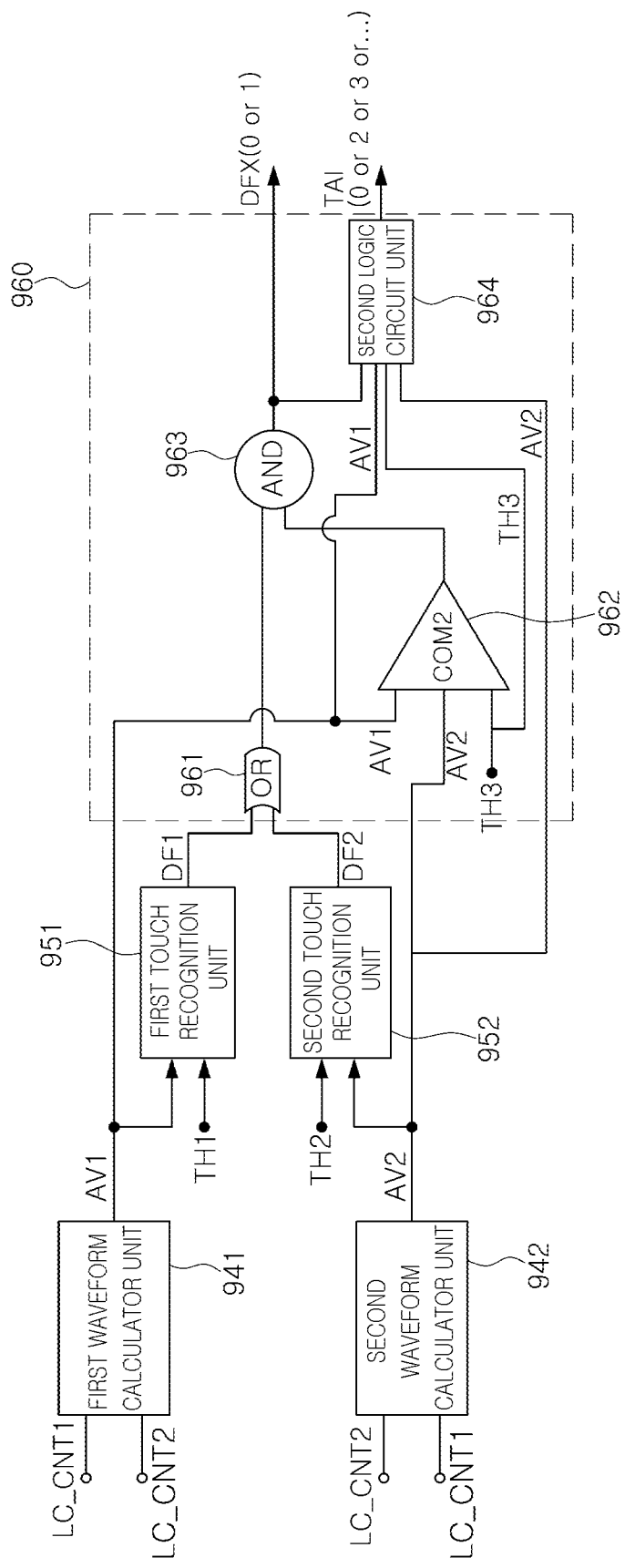
FIG. 11 illustrates an example of a touch operation distinguishing circuit, in accordance with one or more embodiments.

FIG. 11 illustrates an example of the configuration illustrated in FIG. 9.

Referring to FIG. 11, the first waveform calculator unit 941 may generate the first calculation value AV1 by differentiating a difference between a first count value LC_CNT1 and a second count value LC_CNT2, and a sum of the first count value LC_CNT1 and the second count value LC_CNT2.

The second waveform calculator unit 942 may generate a second calculation value AV2 by differentiating a difference between the first count value LC_CNT1 and the second count value LC_CNT2, and a sum of the first count value LC_CNT1 and the second count value LC_CNT2.

When the first calculation value AV1 is higher than a first threshold value TH1, the first touch recognition unit 951 may recognize whether a first touch member TM1 is touched and may generate a first touch recognition flag DF1.

When the second calculation value AV2 is higher than a second threshold value TH2, the second touch recognition unit 952 may recognize whether a second touch member TM2 is touched and may generate a second touch recognition flag DF2. The first threshold value TH1 and the second threshold value TH2 may be the same value or may have different values from each other.

The touch region distinguishing circuit 960 may include an OR gate 961, a second comparator COM2 962, an AND gate 963, and a second logic circuit unit 964.

When at least one of the first touch recognition flag DF1 and the second touch recognition flag DF2 has a relatively high level, the OR gate 961 may primarily output a high level which indicates that a touch operation is performed on at least one of the touch members.

The second comparator COM2 962 may compare the first calculation value AV1, the second calculation value AV2, and the third threshold value TH3 with one another, and when the first calculation value AV1 and the second calculation value AV2 are higher than the third threshold value TH3, the second comparator COM2 962 may secondarily output a high level which indicates that a touch operation is performed on at least one of the touch members.

When an output signal of the OR gate 961 and an output signal of the second comparator COM2 962 are in high mode levels, the AND gate 963 may output a touch detection signal DFX having a relatively high level indicating that a touch operation is being performed.

When the touch detection signal DFX has a relatively high level, and the first calculation value AV1 and the second calculation value AV2 are higher than the third threshold value TH3, the second logic circuit unit 964 may recognize that a touch operation is being performed on a touch member corresponding to a larger value between the first calculation value AV1 and the second calculation value AV2 using the first calculation value AV1, the second calculation value AV2, the third threshold value TH3, and the touch detection signal DFX. Accordingly, as the index TAI for distinguishing touch regions, one of, as non-limiting examples, 0, 1, and 2 may be output.

In an example, with regard to the index TAI for distinguishing touch regions "0" may indicate that no touch is input, the index TAI for distinguishing touch regions "1" may indicate that the first touch member is touched, and the index TAI for distinguishing touch regions "2" may indicate that the second touch member is touched.

Figure 12:
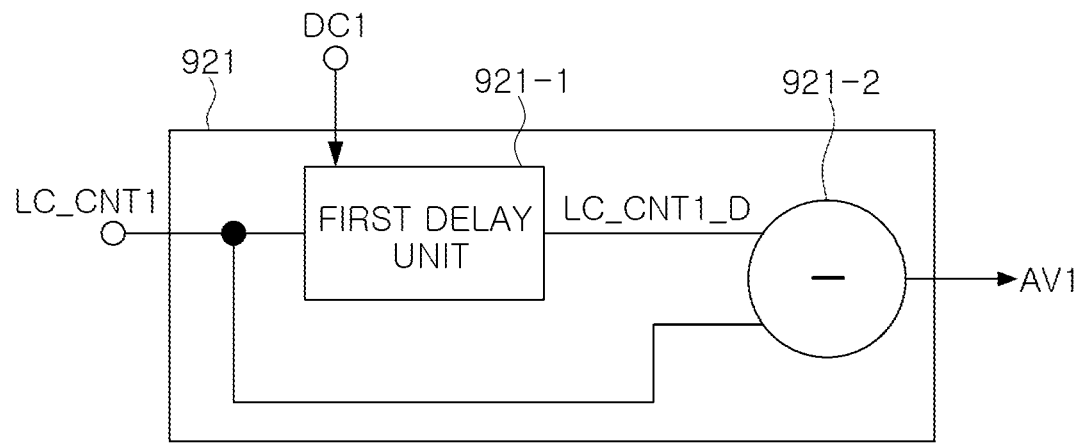
FIG. 12 illustrates an example of a first waveform calculator unit, in accordance with one or more embodiments.

FIG. 12 illustrates an example of a first waveform calculator unit, in accordance with one or more embodiments.

Referring to FIG. 12, a first waveform calculator unit 921 may include a first delay unit 921-1 and a first subtraction unit 921-2.

The first delay unit 921-1 may delay a first count value LC_CNT1 by a predetermined period of time in response to a first delay control signal DC1, and may output a first delay value LC_CNT1_D.

The first subtraction unit 921-2 may subtract the first delay value LC_CNT1_D and the first count value LC_CNT1 and may output a first calculation value AV1. As an example, the first calculation value AV1 may be a differential value which indicates a characteristic of a change of a frequency of the first oscillation signal.

Figure 13:
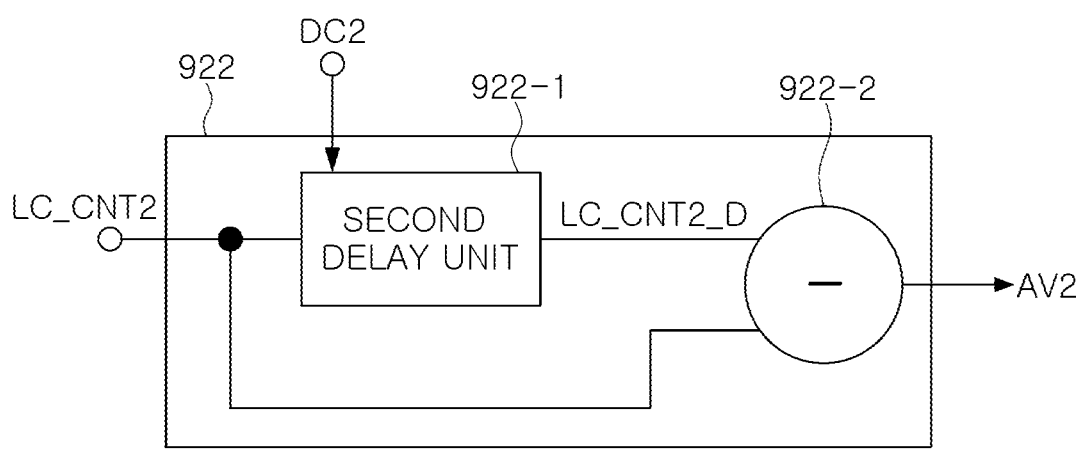
FIG. 13 illustrates an example of a second waveform calculator unit, in accordance with one or more embodiments.

FIG. 13 illustrates an example of a second waveform calculator unit, in accordance with one or more embodiments.

Referring to FIG. 13, a second waveform calculator unit 922 may include a second delay unit 922-1 and a second subtraction unit 922-2.

The second delay unit 922-1 may delay a second count value LC_CNT2 by a predetermined period of time in response to a second delay control signal DC2, and may output a second delay value LC_CNT2_D.

The second subtraction unit 922-2 may subtract the second delay value LC_CNT2_D and the second count value LC_CNT2, and may output a second calculation value AV2. In an example, the second calculation value AV2 may be a differential value which indicates a characteristic of a change of a frequency of the second oscillation signal.

Figure 14:
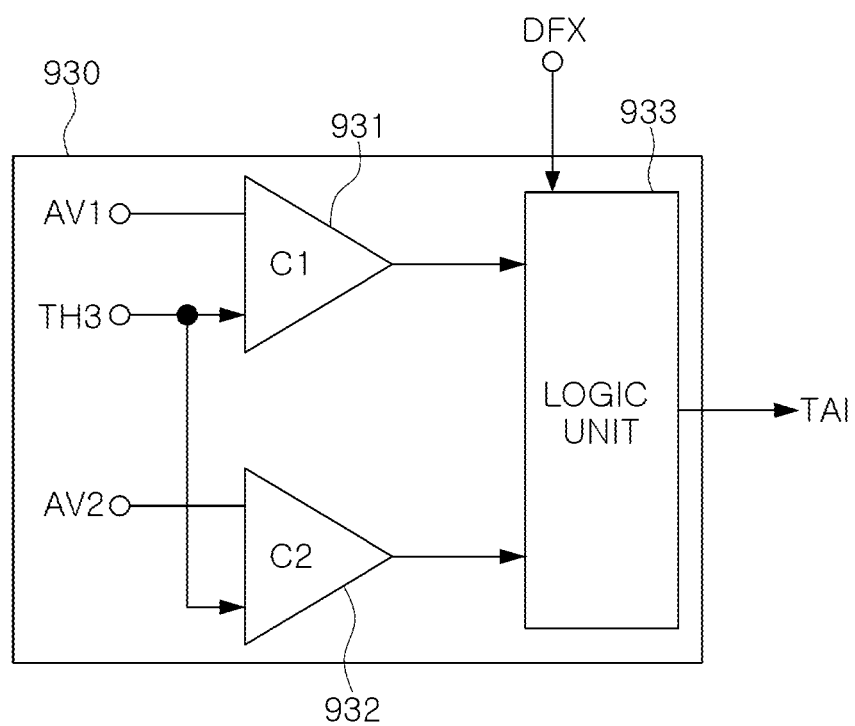
FIG. 14 illustrates an example of a unit for distinguishing touch regions, in accordance with one or more embodiments.

FIG. 14 illustrates an example of a unit for distinguishing touch regions, in accordance with one or more embodiments.

Referring to FIG. 14, in an example, a touch region distinguishing unit 930 may include, as non-limiting examples, a first comparator 931, a second comparator 932, and a logic unit 933.

The first comparator 931 may compare a first calculation value AV1 with a third threshold value TH3, and may output a first comparator value.

The second comparator 932 may compare a second calculation value AV2 with the third threshold value TH3 and may output a second comparator value.

The logic unit 933 may receive a touch detection signal DFX, the first comparator value transmitted from the first comparator 931, and the second comparator value transmitted from the second comparator 932. When the touch detection signal DFX has a relatively high level, the logic unit 933 may distinguish touch regions based on the first comparator value and the second comparator value, and may output an index TAI that distinguishes the touch regions.

In an example, when the first calculation value AV1 is higher than the third threshold value TH3, a first touch member may be recognized as a touch region, and the index TAI for distinguishing touch regions having a value of, for example, "1" may be output.

In an example, when the second calculation value AV2 is higher than a third threshold value TH3, a second touch member may be recognized as a touch region, and the index TAI for distinguishing touch regions having a value of, for example, "2" may be output.

In an example, when both of the first calculation value AV1 and the second calculation value AV2 are less than the third threshold value TH3, a determination may be made that there is no touched region, and the index TAI for distinguishing touch regions having a value of, for example, "0" may be output.

In yet another example, when the second calculation value AV2 is higher than the first calculation value AV1, the first comparator 931 may recognize the second touch member as a touch region, and may output the index TAI for distinguishing touch regions of a low level.

Accordingly, touch regions may be distinguished from each other on the basis of a level of the index TAI for distinguishing touch regions.

When the first and second touch members are initiated, when the index TAI for distinguishing touch regions has a relatively high level, a determination may be made that a touch operation is performed on the first touch member, and when the index TAI for distinguishing touch regions has a relatively low level, a determination may be made that a touch operation is performed on the second touch member.

When the touch operation unit SWP includes a plurality of touch members, the index TAI that distinguishes touch regions may be configured as a signal including a plurality of bits to distinguish the touch regions. As an example, when the index TAI that distinguishes touch regions of two bits is used, three different touch regions may be distinguished from each other.

Figure 15:
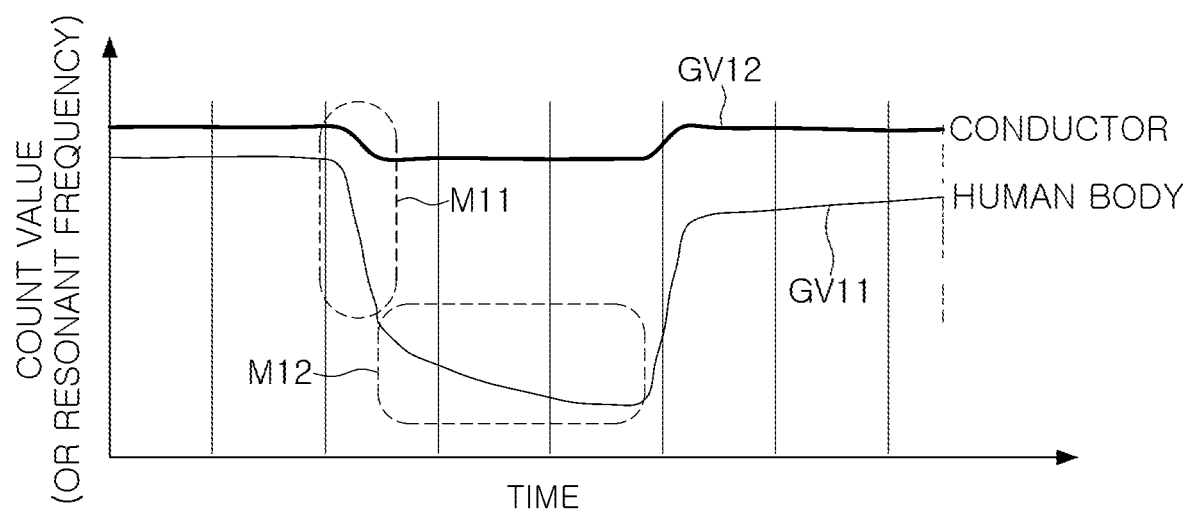
FIG. 15 illustrates a difference in count values between a touch by a human body (hand) and a touch by a conductor (metal), in accordance with one or more embodiments.

FIG. 15 is a diagram illustrating a difference in count values (a first count value or the second count value) between a touch by a human body (e.g., a hand) and a touch by a conductor (e.g., a metal)

In FIG. 15, the graph "GV11" may show a count value measured when a human body (e.g., a hand) touches a touch member of a housing, and the graph "GV12" may show a count value measured when a conductor (e.g., a metal) is in contact with the touch member of a housing.

Referring to mark regions M11 and M12 in the count graphs GV11 and GV12 illustrated in FIG. 15, there may be a difference in reactivity between a touch by a human hand (a hand) and a contact by a conductor (a metal), and contact materials and contact regions may be distinguished from each other through a subsequent calculation process using the mark regions M11 and M12.

Figure 16:
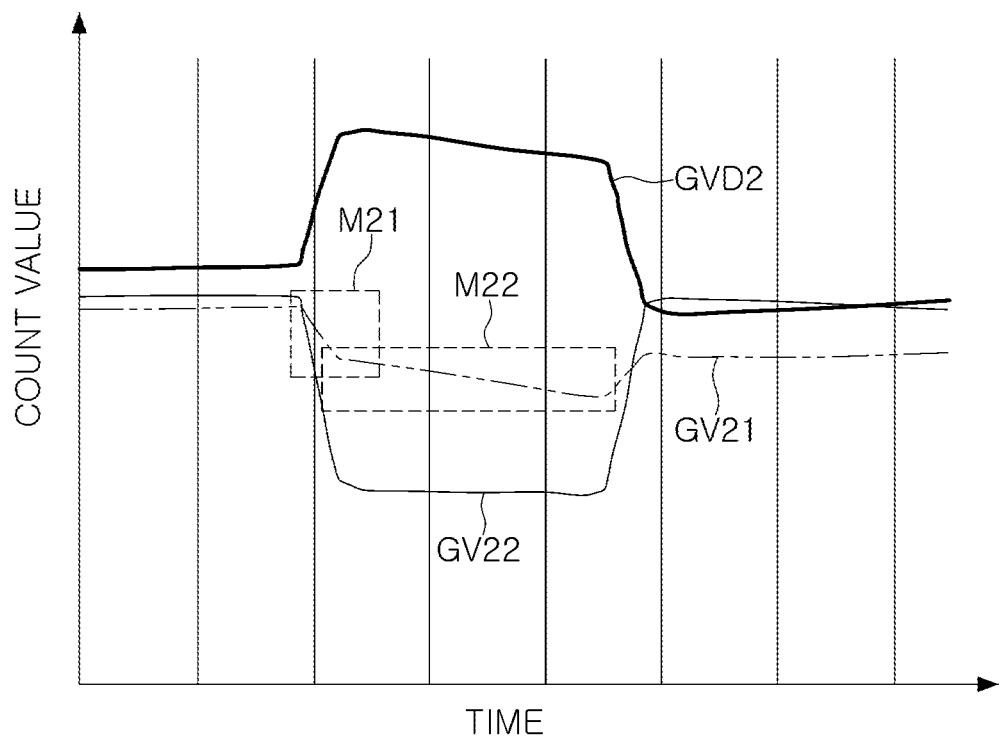
FIG. 16 illustrates changes of first and second count values when a first tough region is touched, in accordance with one or more embodiments.
Figure 17:
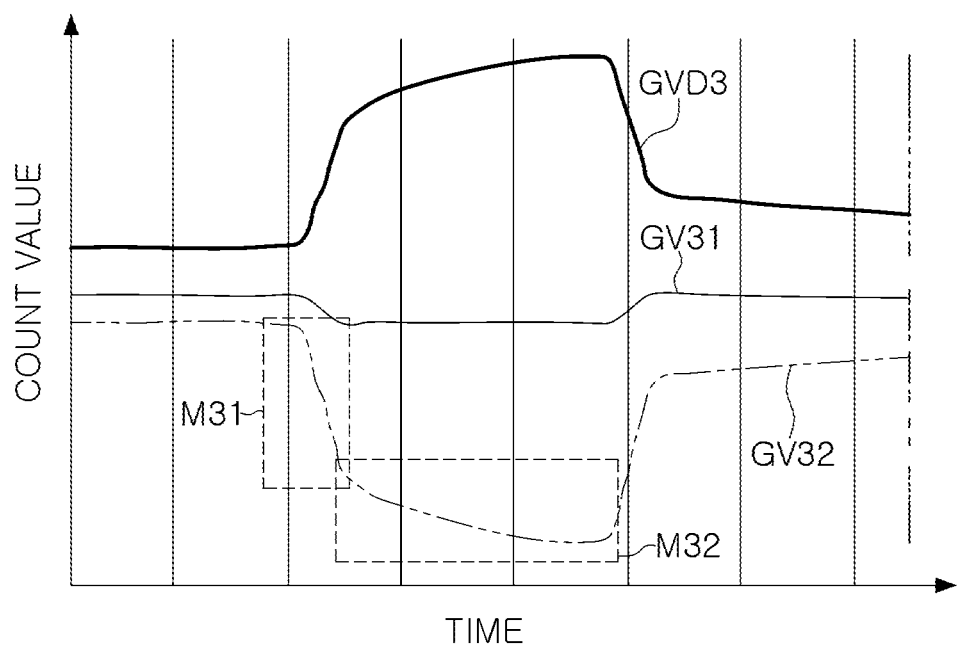
FIG. 17 illustrates changes of first and second count values when a second tough region is touched, in accordance with one or more embodiments.

FIG. 16 illustrates changes of first and second count values when a touch is initiated in a first touch region, in accordance with one or more embodiments. FIG. 17 is a diagram illustrating changes of first and second count values when a touch is initiated in a second touch region, in accordance with one or more embodiments.

In FIG. 16, the graph "GV21" may represent a count value corresponding to a first touch region when a first touch region between first and second touch regions is touched, and the graph "GV22" may represent a count value corresponding to a second touch region when the first touch region is touched. The graph "GVD2" may represent a differential count value obtained by subtracting the count value of the graph GV21 from the count value of the graph GV22. The first touch region may correspond to the first touch member, and the second touch region may correspond to the second touch member.

In FIG. 17, the graph "GV31" may represent a count value corresponding to a first touch region when a second touch region between first and second touch regions is touched, and the graph "GV32" may represent a count value corresponding to a second touch region when the second touch region is touched. The graph GVD3 may represent a differential count value obtained by subtracting the count value of the graph GV31 from the count value of the graph GV32.

Referring to FIGS. 16 and 17, in a non-limiting example, a touch member of a housing may be formed of actual aluminum, and FIGS. 16 and 17 illustrate changes in count values related to a resonant frequency of an oscillation signal appearing when each of the two touch regions, the first touch region and the second touch region, is touched on a surface of the touch members of the integrated housing.

The illustrated region M21 in FIG. 16 indicates a process of a rapid change appearing while a count value moves to a new resonant point after the first touch region is touched by a human body (e.g., a hand) or a conductor (e.g., a metal), and illustrated region M22 indicates an amount of gentle change of a frequency count which continuously appears due to a touch by a human body even after a frequency changes to the new resonant point.

Referring to the illustrated region M21 of the graph GV21 in FIG. 16, a resonant point may decrease by the configuration of a parallel circuit of a touch capacitive component Ctouch added when a human body (e.g., a hand) touches a surface of the touch member, and a reference clock may be counted using a decreased resonant frequency, thereby causing a count value to decrease.

Also, referring to the illustrated region M22 of the graph GV21 corresponding to the first touch region, a slope may continuously change (for example, decrease) even after the arrival at the new resonant point is improved after a touch is input due to the effect by a contact by a human body (e.g., a hand) on a surface of the touch region and heat transmitted therethrough.

Referring to the graph GV22 corresponding to the second touch region, the effect by a touch of the first touch region may be insignificant.

The illustrated region M31 of the graph GV32 in FIG. 17 shows, when a human body (e.g., a hand) or a conductor (e.g., a metal) touches the second touch region, a change rate (a slope) that continuously changes based on the effect of the influence of heat even after the movement of a frequency to the new resonant point, corresponding to the contact surface of the second touch member.

By observing the change rate of the count values appearing on respective touch regions, when a side having a relatively larger change rate is observed, a touch region to which pressure is applied may be found among the first and second (or a plurality of) touch regions.

FIGS. 16 and 17 illustrate in non-limiting examples, the count value of a resonant frequency may be varied depending on an applied system and variations of an environment of the system. For example, when a reference clock is not counted as a resonant frequency, but corresponds to an opposite thereof (a resonant frequency/a reference clock), the change of the count value caused by a reaction when a touch is input, may appear as an opposite aspect, an increase of the count value rather than a decrease of the count value. Additionally, differences from the aspect of temperature transmission caused by differences in inductance L and capacitance C included in an oscillator circuit and in structure and material of the touch members may be combined and varied. In FIG. 13, at least one of the two illustrated regions M11 and M12 in FIG. 16 may be used.

In an example, the amount of change of the count value based on the effect from a contact by a human body, other than the effect by the parallel capacitive element, may not appear to be high as compared to the illustrated region M22 as two channels (first and second) are greatly changing. Thus, a process for showing the effect thereof through a function of a waveform calculation device may be used, which will be described later.

In an example, in the count value illustrated in FIGS. 16 and 17, an offset may be applied to a finally output count value through circuits related to the first and second touch members, respectively.

Even when the circuits and mechanical structures related to the touch members are different from each other or are similar to each other, resonant points thereof may not be the same due to various external factors including a manufacturing tolerance, and accordingly, the change rate may also appear differently for different products/users. Additionally, as illustrated in the diagrams, a change of an offset value, which appears as the effect from a body temperature remains right after a hand is taken off after a touch is input, may also need to be considered, and thus, there may be a limitation in using a raw value. Therefore, a deviation in performance between products may be reduced by an offset and a scaling process, thereby improving reliability. The process thereof will be described later.

When a calculation waveform of a simple raw frequency count value, converted through a secondary calculation, is used, issues associated with the offset may be resolved. For example, when the change rate (a slope=differentiation) is used, a signal may be processed within a certain range at all times such that product performance may improve and implementation resources may also be saved.

For example, the graph GVD2 shows a differential count value obtained by subtracting the count value of the graph GV22 from the count value of the graph GV21, and the graph GVD3 shows a differential count value obtained by subtracting the count value of the graph GV31 from the count value of the graph GV32.

In the time period of illustrated regions M22 and M32 in FIG. 17, when only the graph GVD2 in FIG. 16 is used, or only the graph GVD3 in FIGS. 16 and 17 is used, the first and second touch regions may be distinguished from each other simply by distinguishing whether a change rate of the respective value is positive or negative. When the number of channels increases as the number of buttons are increased, an arithmetic calculation including the increased number of channels may be added and used. Additionally, FIGS. 16 and 17 illustrate how such a waveform calculation process may be used to improve performance for distinguishing contact objects and regions.

Figure 18:
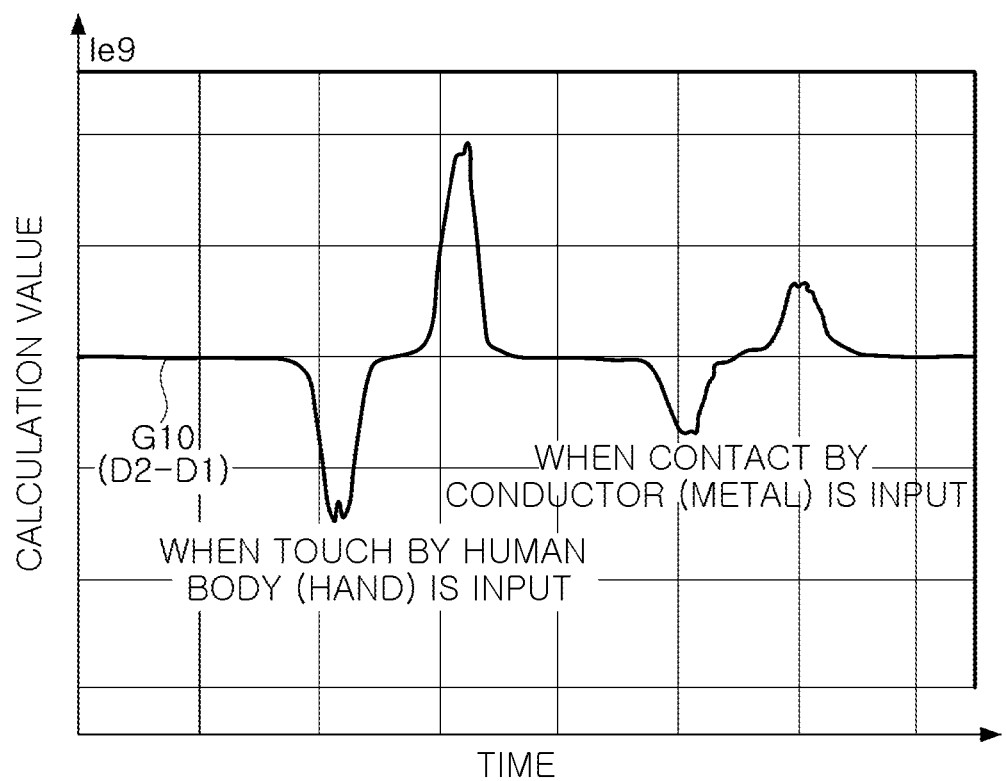
FIG. 18 illustrates a difference in calculation values between a touch by a human body (hand) and a touch by a conductor (metal), in accordance with one or more embodiments.

FIG. 18 illustrates a difference in calculation values between a touch by a human body (e.g., hand) and a touch by a conductor (e.g., metal), in accordance with one or more embodiments.

A calculation value G10 in FIG. 18 indicates how a conductor (e.g., a metal) and a human body (e.g., a hand) are differentiated using differential values of portions corresponding to the illustrated regions M21 and M31 illustrated in FIGS. 16 and 17. In an example, the calculation value in FIG. 18 may not be simply a differential value, and may be a value generated by applying a random algorithm, such as multiplying the differential value by a count value of the differential value, to amplify a difference value.

In an example, temperature transmitted when a touch by a human body (e.g., a hand) is input may cause an increase of a coil element (inductance L) included in a switching operation sensing device such that a change rate of when a touch is input may increase, and may lead to an increased change rate value as in a region illustrated in FIG. 18. A degree of change of the change rate may be compared with a random threshold, and a result of the comparison may be used to distinguish a touch by the human body and a touch by other objects, thereby preventing an incorrect recognition.

Figure 19:
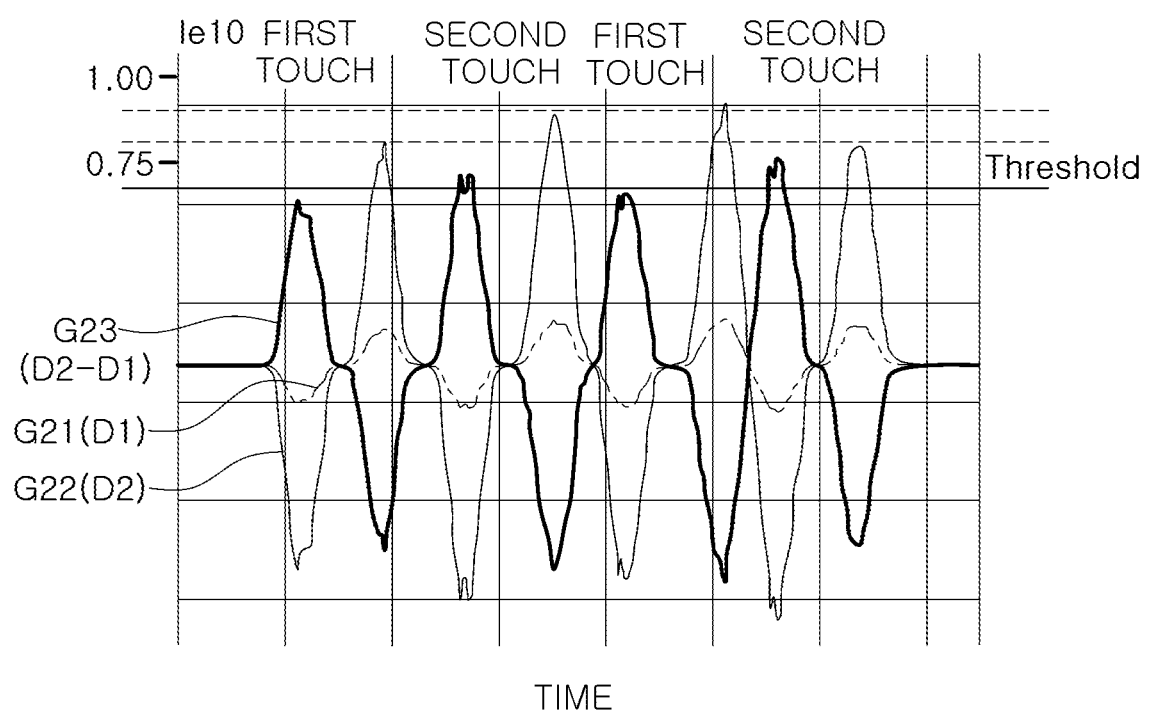
FIG. 19 illustrates a difference between a differential value and a calculation value when first and second touch regions have been touched, in accordance with one or more embodiments.

FIG. 19 illustrates a difference between a differential value and a calculation value when first and second touch regions have been touched.

Graphs G21 (D1), G22 (D2), and G23(D2-D1) in FIG. 19 indicate that an additional calculation process may be used to decrease a deviation in products, in addition to the amount of change illustrated in FIGS. 16 and 17.

In FIG. 19, when first and second touch members are included, graph G21 (D1) may be a differential value of a count value corresponding to the first touch member when the first touch member is touched, and when the first and second touch members are included, graph G22 (D2) may be a differential value of a count value corresponding to the second touch member when the second touch member is touched. Graph G23 (D2-D1) may be a value obtained by scaling a difference between a differential value of graph G21 (D1) and a differential value of graph G22 (D2).

In FIG. 19, with regard to an order of experiments, a process of touching the first touch member by a hand and then removing the hand from the first touch member, and touching the second touch member by the hand and then removing the hand from the second touch member may be repeatedly performed, and positive and negative values of an amount of change may alternately appear.

Referring to graphs G21 (D1), G22 (D2), and G23 (D2-D1) in FIG. 19, it is illustrated that, even when the first and second touch members are alternately and constantly pressed by the same finger, degrees of change of the change rates (G21 (D1) and G22 (D2)) thereof may be different because temperatures that are sensed when the hand touches the touch members, temperatures of touch regions which change when a touch is repeatedly input, sizes of portions of the touched finger, and the like, may be different. However, when a difference value G23(D2-D1) related to the above-mentioned values are used, a constant degree of change may appear whenever the first and second touch members have been touched regardless of the differential values of G21 (D1) and G22 (D2) calculated from each channel, and accordingly, the difference value may be used to distinguish touch regions of the touch members. In an example, in FIG. 19, with reference to a threshold value, a section below the threshold value indicates that the first touch member is touched, and a section above the threshold value indicates that the second touch member is touched.

The above-described touch member may be applied to an electrical device that implements a touch member. In an example, the touch member may replace a volume switch and a power switch of a laptop computer, switches of virtual reality (VR) devices, a head mount display (HMD), Bluetooth earphones, a stylus touch pen, or the like, and may also replace buttons of a monitor of a home appliance, a refrigerator, a laptop, and the like.

The touch member described in the aforementioned example embodiments may not be limited to the above-mentioned devices, and may be applied to a device such as a mobile device, a wearable device, and the like, which have switches. Additionally, by applying the touch member, an integrated design may be implemented.

According to the aforementioned example embodiments, when an integrated housing of an electrical device is used as a touch region, a plurality of touch regions may be distinguished from each other without an isolation or shielding structure or an interference prevention circuit with respect to the different touch regions.

Additionally, in the process of recognizing a touch based on a change of a count value obtained by counting an oscillation frequency caused by LC resonance, by reflecting the effect from external change factors such as a material of a surface of a touch region, temperature of a human body (e.g., a second object) applying a touch, and the like, to an oscillation frequency, a plurality of touch regions of an integrated housing and touch objects (a human or an object including metals) may be distinguished from each other without an isolation or shielding structure or an interference prevention circuit.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switching operation sensing device to be added to an electronic device, the electronic device comprising an input operation unit comprising a first touch member and a second touch member, the switching operation sensing device; comprising: an oscillator circuit configured to generate a first oscillation signal based on a first variable resonant frequency when the first touch member is touched, and generate a second oscillation signal based on a second variable resonant frequency when the second touch member is touched; and a touch detector circuit; comprising: a frequency calculator circuit, configured to convert the first oscillation signal and the second oscillation signal into a first count value and a second count value; and a touch operation distinguishing circuit, configured to distinguish respective touch regions of the first touch member and the second touch member, based on calculation values generated based on the first count value and the second count value.

2. The device of claim 1, wherein the first touch member and the second touch member are formed in different regions of a housing.

3. The device of claim 1, wherein the touch detector circuit is configured to detect whether at least one of the first touch member and the second touch member is touched, and to distinguish the respective touch regions, based on a change in a frequency of the first oscillation signal and a change in a frequency of the second oscillation signal.

4. The device of claim 3, wherein the oscillator circuit comprises:
a first oscillator circuit configured to generate the first oscillation signal based on a change in impedance from a touch operation input through the first touch member; and
a second oscillator circuit configured to generate the second oscillation signal based on a change in impedance from a touch operation input through the second touch member.

5. The device of claim 4, wherein the first oscillator circuit comprises:
a first inductance circuit configured to provide a variable inductance when a touch by a first object is input through the first touch member;
a first capacitance circuit configured to have a variable capacitance when a touch by a second object is input through the first touch member; and
a first amplifier circuit configured to generate the first oscillation signal having the first variable resonant frequency;
wherein the first variable resonant frequency is generated by the first inductance circuit and the first capacitance circuit.

6. The device of claim 5, wherein the first object is a conductor, and the second object is a human body.

7. The device of claim 4, wherein the second oscillator circuit comprises:
a second inductance circuit configured to provide a variable inductance when a touch by a first object is input through the second touch member;
a second capacitance circuit configured to have a variable capacitance when a touch by a second object is input through the second touch member; and a second amplifier circuit configured to generate the second oscillation signal having the second variable resonant frequency;

wherein the second variable resonant frequency is generated by the second inductance circuit and the second capacitance circuit.

8. The device of claim 7, wherein the first object is a conductor, and the second object is a human body.

9. The device of claim 3, wherein the frequency calculator circuit comprises:
a first frequency calculator circuit configured to convert the first oscillation signal to a first count value; and
a second frequency calculator circuit configured to convert the second oscillation signal to a second count value.

10. The device of claim 3, wherein the touch operation distinguishing circuit is configured to distinguish objects touched through the first touch member and the second touch member based on the change in the frequency of the first oscillation signal and the change in the frequency of the second oscillation signal.

11. The device of claim 3, wherein the touch operation distinguishing circuit comprises:
a first touch detector configured to detect whether the first touch member is touched based on the first count value, and generate a first touch recognition flag;
a second touch detector configured to detect whether the second touch member is touched based on the second count value, and generate a second touch recognition flag;
a first waveform calculator configured to generate a first calculation value by calculating the first count value and the second count value based on the first touch recognition flag when a touch operation is detected;
a second waveform calculator configured to generate a second calculation value by calculating the second count value and the first count value based on the second touch recognition flag when the touch operation is detected; and
a touch region distinguishing circuit configured to compare the first calculation value with the second calculation value, generate an index to distinguish the respective touch regions, and generate a touch detection signal.

12. The device of claim 11, wherein the first touch detector is configured to compare the first count value with a first threshold value, and generate the first touch recognition flag with a relatively high level when the first object is touched.

13. The device of claim 11, wherein the second touch detector is configured to compare the second count value with the first threshold value, and generate the second touch recognition flag with a relatively high level when the first object is touched.

14. The device of claim 11, wherein the first waveform calculator comprises: a first delay unit a configured to output a first delay value by delaying the first count value by a predetermined period of time in response to a first delay control signal; and a first subtraction circuit configured to output the first calculation value by subtracting the first delay value and the first count value.

15. The device of claim 11, wherein the second waveform calculator comprises: a second delay unit configured to output a second delay value by delaying the second count value by a predetermined period of time in response to a second delay control signal; and a second subtraction circuit configured to output the second calculation value by subtracting the second delay value and the second count value.

16. The device of claim 11, wherein the touch region distinguishing circuit is configured to compare the first calculation value, the second calculation value, and a threshold value with each other, and determine that the first touch member is a touch region when the first calculation value is greater than the threshold value and the second calculation value.

17. The device of claim 11, wherein the touch region distinguishing circuit is configured to compare the first calculation value, the second calculation value, and a threshold value with each other, and determine that the second touch member is a touch region when the second calculation value is greater than the threshold value and the first calculation value.

18. The device of claim 3, wherein the touch operation distinguishing circuit further comprises:
a first waveform calculator configured to generate a first calculation value by calculating the first count value and the second count value;
a second waveform calculator configured to generate a second calculation value by calculating the second count value and the first count value;
a first touch detector configured to determine whether the first touch member is touched based on the first calculation value, and generate a first touch recognition flag;
a second touch detector configured to determine whether the second touch member is touched based on the second calculation value, and generate a second touch recognition flag; and
a touch region distinguishing circuit configured to generate a touch detection signal based on the first touch recognition flag, the second touch recognition flag, the first calculation value, and the second calculation value, to compare the first calculation value with the second calculation value, and generate an index to distinguish the respective touch regions.

19. The device of claim 1, wherein the device is any one of a Bluetooth headset, a Bluetooth earpiece, smart glasses; a virtual reality (VR) headset, an Augmented Reality (AR) headset, a laptop, a computer, a smart phone, an entrance key of a vehicle, and a stylus touch pen.

20. The device of claim 1, wherein the touch detector circuit is further configured to detect the respective touch regions based on the generated first oscillation signal and the generated second oscillation signal.

21. An apparatus comprising: an input operation unit comprising a plurality of detectors; an oscillation circuit configured to generate a plurality of oscillation signals; and a detector circuit configured to convert the generated oscillated signals to respective count values, and distinguish touch regions associated with each of the plurality of detectors by comparing each of the respective count values to a threshold value, and output a touch detection signal based on a result of the comparing.

22. The apparatus of claim 21, wherein the oscillation signals have a variable resonant frequency that is based on the detected touch.

23. The apparatus of claim 21, wherein a first type of touch is detected by a capacitive sensing, and a second type of touch is detected by an inductive sensing.

24. The apparatus of claim 23, wherein the first type of touch is a human touch and the second type of touch is a non-human touch.

* * * * *